United States Patent
Lin et al.

(10) Patent No.: US 10,971,355 B2
(45) Date of Patent: Apr. 6, 2021

(54) SUBSTRATES AND METHODS FOR FORMING THE SAME

(71) Applicant: Vanguard International Semiconductor Corporation, Hsinchu (TW)

(72) Inventors: Kwang-Ming Lin, Taichung (TW); Yung-Fong Lin, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 26 days.

(21) Appl. No.: 16/690,408

(22) Filed: Nov. 21, 2019

(65) Prior Publication Data
US 2020/0350410 A1 Nov. 5, 2020

(30) Foreign Application Priority Data
May 3, 2019 (TW) .................. 108115312

(51) Int. Cl.
*H01L 21/02* (2006.01)
*H01L 29/205* (2006.01)

(52) U.S. Cl.
CPC .... *H01L 21/0214* (2013.01); *H01L 21/02389* (2013.01); *H01L 21/02425* (2013.01); *H01L 21/02428* (2013.01); *H01L 29/205* (2013.01)

(58) Field of Classification Search
CPC ......... H01L 21/02002; H01L 21/02104; H01L 21/02107; H01L 21/02109; H01L 21/02123; H01L 21/0214; H01L 21/02365; H01L 21/02367; H01L 21/0237; H01L 21/02389; H01L 21/02425; H01L 21/02428; H01L 21/02436; H01L 21/02439; H01L 21/02488; H01L 21/02491; H01L 21/02496; H01L 21/02505; H01L 21/02518; H01L 21/02521; H01L 21/0254; H01L 21/02697; H01L 29/12; H01L 29/20; H01L 29/2003; H01L 29/201; H01L 29/205
See application file for complete search history.

(56) References Cited

U.S. PATENT DOCUMENTS

2017/0288055 A1 10/2017 Aktas et al.

FOREIGN PATENT DOCUMENTS

| TW | 201816204 A | 5/2018 |
|---|---|---|
| TW | 201816849 A | 5/2018 |

*Primary Examiner* — Cheung Lee
(74) *Attorney, Agent, or Firm* — Birch, Stewart, Kolasch & Birch LLP

(57) ABSTRACT

A substrate includes a ceramic core, a first adhesion layer, a barrier layer, and a second adhesion layer. The first adhesion layer encapsulates the ceramic core and includes silicon oxynitride, wherein the atomic number ratio of oxygen to nitrogen in silicon oxynitride of the first adhesion layer has a first ratio. The barrier layer encapsulates the first adhesion layer and includes silicon oxynitride, wherein the atomic number ratio of oxygen to nitrogen in silicon oxynitride of the barrier layer has a second ratio that is different from the first ratio. The second adhesion layer encapsulates the barrier layer and includes silicon oxynitride, wherein the atomic number ratio of oxygen to nitrogen in silicon oxynitride of the second adhesion layer has a third ratio that is different from the second ratio.

20 Claims, 3 Drawing Sheets

SUBSTRATES AND METHODS FOR FORMING THE SAME

CROSS REFERENCE TO RELATED APPLICATIONS

This Application claims priority of Taiwan Patent Application No. 108115312, filed on May 3, 2019, the entirety of which is incorporated by reference herein.

BACKGROUND

Technical Field

The embodiments of the present disclosure relate to semiconductor manufacturing, and in particular they relate to semiconductor devices and methods for forming the same.

Description of the Related Art

A semiconductor structure includes a substrate and an epitaxial layer on the substrate. Since the epitaxial layer and the substrate include different materials, the formation of the epitaxial layer uses a heterogeneous epitaxial growth process. Due to problems such as the different lattice constants of the materials, the heterogeneous epitaxial growth process tends to form a defective epitaxial layer. Therefore, it is necessary to improve the substrate.

Although existing substrates are generally adequate, they are not satisfactory in every respect. For example, the substrate includes a multilayer structure, and the substrate formed by a complicated process not only increases the production cost, but also causes the substrate to have defects, thereby reducing the yield. Therefore, there is a need to further improve the substrate and the method for forming the same to reduce the production cost and increase yield and reliability.

BRIEF SUMMARY

In accordance with some embodiments of the present disclosure, a substrate is provided. The substrate includes a ceramic core; a first adhesion layer encapsulating the ceramic core and including silicon oxynitride, wherein the atomic number ratio of oxygen to nitrogen in silicon oxynitride of the first adhesion layer has a first ratio; a barrier layer encapsulating the first adhesion layer and including silicon oxynitride, wherein the atomic number ratio of oxygen to nitrogen in silicon oxynitride of the barrier layer has a second ratio that is different from the first ratio; and a second adhesion layer encapsulating the barrier layer and including silicon oxynitride, wherein the atomic number ratio of oxygen to nitrogen in silicon oxynitride of the second adhesion layer has a third ratio that is different from the second ratio.

In some embodiments, the first ratio and the third ratio are each independently in a range from 6:4 to 9:1.

In some embodiments, the second ratio is in a range from 1:9 to 4:6.

In some embodiments, the ratio of the thickness of the barrier layer to the thickness of the first adhesion layer or the thickness of the second adhesion layer is in a range from 3 to 6.

In some embodiments, the ceramic core includes aluminum nitride, gallium nitride, aluminum gallium nitride, silicon carbide, zinc oxide, gallium oxide, or a combination thereof.

In some embodiments, the substrate further includes an epitaxial layer disposed on a first side of the second adhesion layer and including a III-V semiconductor material; and a bonding layer disposed between the epitaxial layer and the second adhesion layer.

In some embodiments, the substrate further includes a filling layer disposed between the bonding layer and the second adhesion layer.

In some embodiments, the substrate further includes a conductive layer disposed on a second side of the second adhesion layer, wherein the second side is opposite the first side.

In some embodiments, a sidewall of the conductive layer is coplanar with a sidewall of a third side of the second adhesion layer, and the third side is between the first side and the second side.

In some embodiments, the conductive layer includes Ti, TiN, Co, Ni, Pt, Ta, TaN, SiCr, or a combination thereof.

In some embodiments, the thickness of the conductive layer is in a range from 1000 Å to 10000 Å.

According to some embodiments of the present disclosure, a method for forming substrates is provided. The method includes providing a ceramic core; and providing a silicon source, an oxygen source, and a nitrogen source during a deposition process to sequentially form a first adhesion layer encapsulating the ceramic core, a barrier layer encapsulating the first adhesion layer, and a second adhesion layer encapsulating the barrier layer, wherein the atomic number ratio of oxygen to nitrogen of the first adhesion layer, the atomic number ratio of oxygen to nitrogen of the barrier layer, and the atomic number ratio of oxygen to nitrogen of the second adhesion layer have a first ratio, a second ratio, and a third ratio, respectively, and wherein the second ratio is different from the first ratio, and the third ratio is different from the second ratio.

In some embodiments, the first ratio and the third ratio are each independently in a range from 6:4 to 9:1.

In some embodiments, the second ratio is in a range from 1:9 to 4:6.

In some embodiments, the oxygen source includes water vapor, oxygen, ozone, or a combination thereof, the nitrogen source includes ammonia, nitrogen, or a combination thereof, and the deposition process includes adjusting the flow rate ratio of oxygen to nitrogen from 8:2 to 2:8 and then to 8:2.

In some embodiments, the deposition process includes a chemical vapor deposition process.

In some embodiments, the method further includes forming a bonding layer on a first side of the second adhesion layer; forming an epitaxial layer on the bonding layer; and forming a conductive layer on a second side of the second adhesion layer, wherein the second side is opposite the first side.

In some embodiments, a sidewall of the conductive layer is coplanar with a sidewall of a third side of the second adhesion layer, and the third side is between the first side and the second side.

In some embodiments, the conductive layer includes Ti, TiN, Co, Ni, Pt, Ta, TaN, SiCr, or a combination thereof.

In some embodiments, the method further includes forming a filling layer prior to forming the bonding layer, wherein the filling layer includes a multilayer structure.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1A:
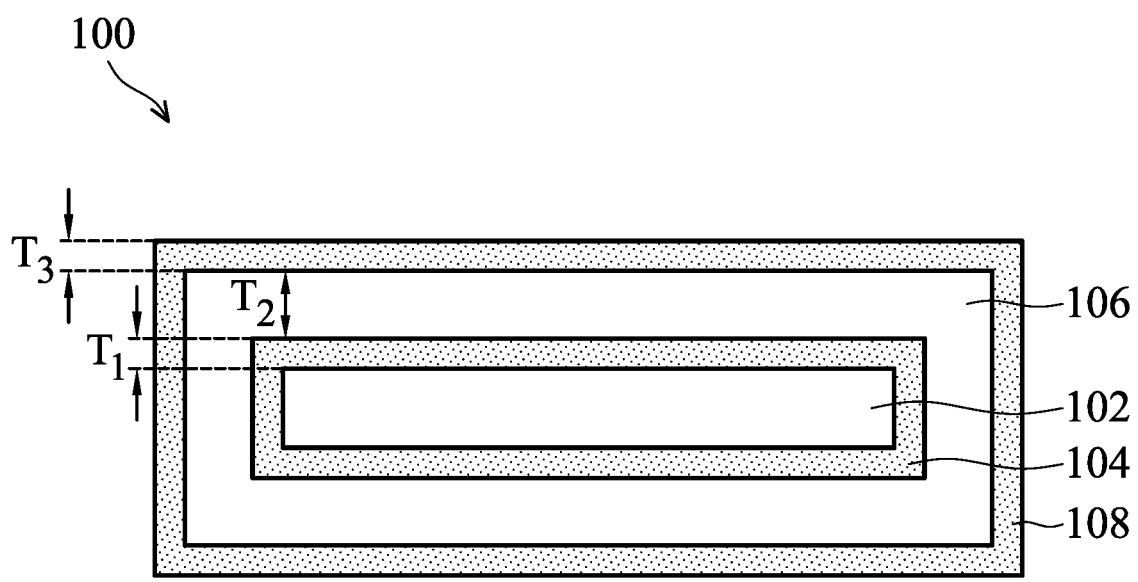
FIGS. 1A-1B are cross-sectional views illustrating a substrate at various stages of manufacture in accordance with some embodiments of the present disclosure.

The following outlines several embodiments so that those skilled in the art may better understand the present disclosure. However, these embodiments are examples only and are not intended to limit the present disclosure. It is understandable that those skilled in the art may adjust the embodiments described below according to requirements, for example, changing the order of processes and/or including more or fewer steps than described herein, and these adjustments do not depart from the scope of the present disclosure.

Furthermore, other elements may be added on the basis of the embodiments described below. For example, the description of "forming a second element on a first element" may include embodiments in which the first element is in direct contact with the second element, and may also include embodiments in which additional elements are disposed between the first element and the second element such that the first element and the second element are not in direct contact, and spatially relative descriptors of the first element and the second element may change as the device is operated or used in different orientations. In addition, the present disclosure may repeat reference numerals and/or letters in the various examples. This repetition is merely for the purpose of simplicity and clarity, and does not in itself dictate a relationship between the various embodiments discussed.

A substrate and a method for forming the same are described in accordance with some embodiments of the present disclosure. The substrate of the present disclosure includes an adhesion layer and a barrier layer having silicon oxynitride, which can reduce the number of process steps, thereby improving the yield of the substrate and reducing the production cost.

Figure 1B:
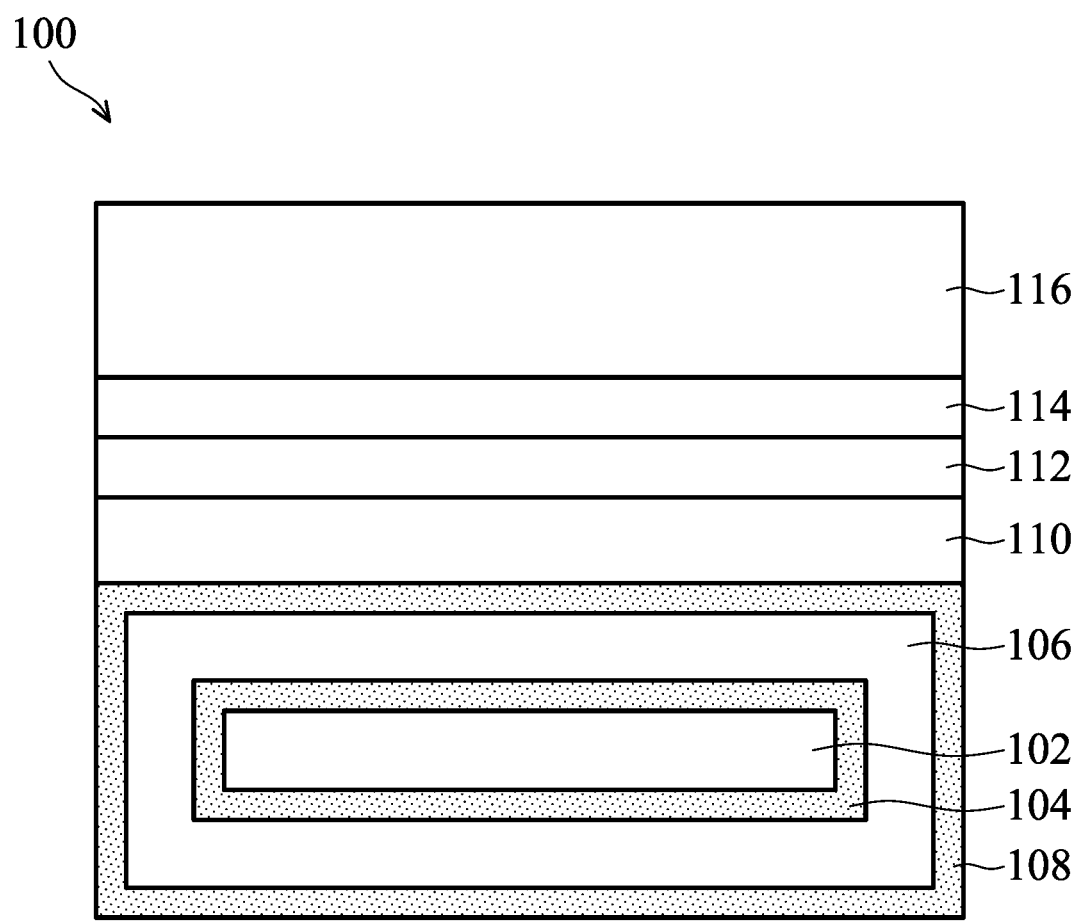

FIGS. 1A-1B are cross-sectional views illustrating a substrate 100 at various stages of manufacture in accordance with some embodiments of the present disclosure. In some embodiments, as illustrated in FIG. 1A, the substrate 100 includes a ceramic core 102. In some embodiments, the ceramic core 102 includes aluminum nitride (AlN), gallium nitride (GaN), aluminum gallium nitride (AlGaN), silicon carbide (SiC), zinc oxide (ZnO), gallium oxide ($Ga_2O_3$), the like, or a combination thereof. In some embodiments, the thickness of the ceramic core 102 may be in a range from about 100 micrometers (μm) to about 1500 μm, such as from about 700 μm to about 800 μm.

Then, a deposition process is performed to sequentially form a first adhesion layer 104 encapsulating the ceramic core 102, a barrier layer 106 encapsulating the first adhesion layer 104, and a second adhesion layer 108 encapsulating the barrier layer 106 in accordance with some embodiments. In some embodiments, the deposition process may include a chemical vapor deposition (CVD) process, such as a low pressure CVD (LPCVD) process.

During the deposition process, a silicon source, an oxygen source, and a nitrogen source are provided. For example, the silicon source may include silane ($SiH_4$), tetraethylorthosilicate (TEOS), the like, or a combination thereof. For example, the oxygen source may include water vapor ($H_2O$), oxygen ($O_2$), ozone ($O_3$), the like, or a combination thereof. For example, the nitrogen source can include ammonia ($NH_3$), nitrogen ($N_2$), the like, or a combination thereof.

The first adhesion layer 104, the barrier layer 106, and the second adhesion layer 108 all including silicon oxynitride are formed by adjusting the flow rate ratio of the oxygen source to the nitrogen source during the deposition process, wherein the atomic number ratio of oxygen to nitrogen (number of oxygen atoms: number of nitrogen atoms) in silicon oxynitride of the first adhesion layer 104 is a first ratio, the atomic number ratio of oxygen to nitrogen (number of oxygen atoms: number of nitrogen atoms) in silicon oxynitride of the barrier layer 106 is a second ratio, and the atomic number ratio of oxygen to nitrogen (number of oxygen atoms: number of nitrogen atoms) in silicon oxynitride of the second adhesion layer 108 is a third ratio. The first ratio and the third ratio are different from the second ratio. The third ratio may be the same as or different from the first ratio.

In some embodiments, when the first adhesion layer 104 is formed, the flow rate ratio of oxygen to nitrogen is adjusted to about 8:2 with oxygen as the oxygen source and nitrogen as the nitrogen source, so that the first ratio of the atomic number ratio of oxygen to nitrogen in silicon oxynitride of the first adhesion layer 104 is in a range from about 6:4 to about 9:1, such as about 8:2. When different oxygen sources and nitrogen sources are used, the flow rate ratio of the oxygen source to the nitrogen source varies with the number of oxygen atoms and the number of nitrogen atoms included in each. For example, in an embodiment where water vapor is used as the oxygen source and nitrogen is used as the nitrogen source, the flow rate ratio of water vapor to nitrogen is adjusted to about 16:2, so that the first ratio of the atomic number ratio of oxygen to nitrogen in silicon oxynitride of the first adhesion layer 104 is in a range from about 6:4 to about 9:1.

Since the number of oxygen atoms is higher than the number of nitrogen atoms, the formed silicon oxynitride has good adhesion, and can provide adhesion between the subsequently deposited layer and the ceramic core 102. In some embodiments, the first adhesion layer 104 has a thickness T1 ranging from about 100 Å to about 2000 Å, such as from about 800 Å to about 1200 Å. In accordance with some embodiments, the first adhesion layer 104 with this thickness range can make the layer subsequently formed thereon less likely to fall off.

In some embodiments, when the barrier layer 106 is formed, the flow rate ratio of oxygen to nitrogen is adjusted to about 2:8 with oxygen as the oxygen source and nitrogen as the nitrogen source, so that the second ratio of the atomic number ratio of oxygen to nitrogen in silicon oxynitride of the barrier layer 106 is in a range from about 1:9 to about 4:6, such as about 2:8. As previously discussed, the flow rate ratio of the oxygen source to the nitrogen source varies with the number of oxygen atoms and the number of nitrogen atoms included in each. Since the number of nitrogen atoms is higher than the number of oxygen atoms, the formed silicon oxynitride can avoid materials in the ceramic core 102 diffusing out and/or materials outside the barrier layer 106 diffusing into the ceramic core 102. These diffusions cause defects and reduce the reliability of the substrate 100.

In some embodiments, the barrier layer 106 has a thickness T2 ranging from about 3000 Å to about 6000 Å, such as from about 4000 Å to about 5000 Å. In accordance with some embodiments, the barrier layer 106 with this thickness range can avoid or minimize diffusion of materials. In some embodiments, a ratio of the thickness T2 of the barrier layer 106 to the thickness T1 of the first adhesion layer 104 is in a range from about 3 to about 6, such as from about 4 to about 5.

In some embodiments, when the second adhesion layer 108 is formed, the flow rate ratio of oxygen to nitrogen is adjusted to about 8:2 with oxygen as the oxygen source and nitrogen as the nitrogen source, so that the third ratio of the atomic number ratio of oxygen to nitrogen in silicon oxynitride of the second adhesion layer 108 is in a range from about 6:4 to about 9:1, such as about 8:2. As discussed above, the flow rate ratio of the oxygen source to the nitrogen source varies with the number of oxygen atoms and the number of nitrogen atoms included in each. Since the number of oxygen atoms is higher than the number of nitrogen atoms, the formed silicon oxynitride has a good adhesion, and can provide adhesion between the subsequently deposited layer and the barrier layer 106. In some embodiments, the second adhesion layer 108 has a thickness T3 ranging from about 100 Å to about 2000 Å, such as from about 800 Å to about 1200 Å. In accordance with some embodiments, the second adhesion layer 108 with this thickness range can make the layer subsequently formed thereon less likely to fall off. In some embodiments, a ratio of the thickness T2 of the barrier layer 106 to the thickness T3 of the second adhesion layer 108 is in a range from about 3 to about 6, such as from about 4 to about 5.

Although the thickness T1 of the first adhesion layer 104 is substantially equal to the thickness T3 of the second adhesion layer 108 as illustrated in FIG. 1A, the present disclosure is not limited thereto. The thickness T1 of the first adhesion layer 104 and/or the thickness T3 of the second adhesion layer 108 may be adjusted such that the thickness T1 of the first adhesion layer 104 is greater or smaller than the thickness T3 of the second adhesion layer 108.

In comparison with forming a substrate including an adhesive layer and a barrier layer having different materials, the present disclosure forms the first adhesion layer 104, the barrier layer 106 and the second adhesion layer 108 including silicon oxynitride having different atomic number ratios of nitrogen to oxygen by adjusting the flow rate ratio of the oxygen source to the nitrogen source during the deposition process, which can simplify the process and reduce the production cost of the substrate 100, and can avoid forming undesirable defects in the substrate 100, thereby improving yield and reliability of the substrate 100.

The first adhesion layer 104, the barrier layer 106 and the second adhesion layer 108 all include silicon oxynitride, wherein the atomic number ratio of oxygen to nitrogen in silicon oxynitride of the adhesion layer is different from the atomic number ratio of oxygen to nitrogen in silicon oxynitride of the barrier layer. In an embodiment, an intra-layer distribution in each layer can be adjusted by adjusting the flow rate ratio of the oxygen source to the nitrogen source during the deposition process, so that the first adhesion layer 104, the barrier layer 106, and the second adhesion layer 108 become a composition-graded layer.

Then, as illustrated in FIG. 1B, a filling layer 110 is formed on a first side of the second adhesion layer 108 in accordance with some embodiments. The filling layer 110 can fill holes on a surface of the first adhesion layer 106 so that the subsequent layer may be formed on a flat surface. In some embodiments, the filling layer 110 may be formed by a CVD process, a spin coating process, the like, or a combination thereof. In some embodiments, the filling layer 110 may include borophosphosilicate glass (BPSG), borosilicate glass (BSG), phosphosilicate glass (PSG), fluorinated silicate glass (FSG), spin-on glass (SOG), plasma enhanced oxide (PEOX), the like, a multilayer thereof, or a combination thereof.

Then, a bonding layer 112 is formed on the filling layer 110 in accordance with some embodiments. In some embodiments, the bonding layer 112 may be formed by a CVD process, and the bonding layer 112 may include silicon oxide. The bonding layer 112 can provide a bond between the subsequently formed layer and the filling layer 110. In some embodiments, the thickness of the bonding layer 112 is in a range from about 5,000 Å to about 20000 Å, such as from about 10000 Å to about 15000 Å.

Then, a single crystal layer 114 is formed on the bonding layer 112 in accordance with some embodiments. The crystal lattice of the single crystal layer 114 is matched with the crystal lattice of the epitaxial layer subsequently formed thereon, which can provide a surface which is relatively easy to grow the epitaxial layer. In some embodiments, the single crystal layer 114 may be bonded to the bonding layer 112 by a layer transfer process. In some embodiments, the single crystal layer 114 includes silicon (111).

Then, an epitaxial layer 116 is formed on the single crystal layer 114 in accordance with some embodiments. In some embodiments, the epitaxial layer 116 may be formed by a CVD process, such as a LPCVD process. In some embodiments, the epitaxial layer 116 may include a III-V semiconductor material, such as gallium nitride.

In the above embodiment, the present disclosure adjusts the flow rate ratio of the oxygen source to the nitrogen source during the deposition process, wherein different flow rate ratios of the oxygen source to the nitrogen source are respectively applicable to forming an adhesive layer or a barrier layer to form the first adhesion layer 104, the barrier layer 106, and the second adhesion layer 108 which include silicon oxynitride having different atomic number ratios of nitrogen to oxygen. Therefore, process complexity and the production cost of the substrate 100 can be reduced, and undesirable defects formed in the substrate 100 can be avoided, thereby improving the yield and reliability of the substrate 100.

Figure 2:
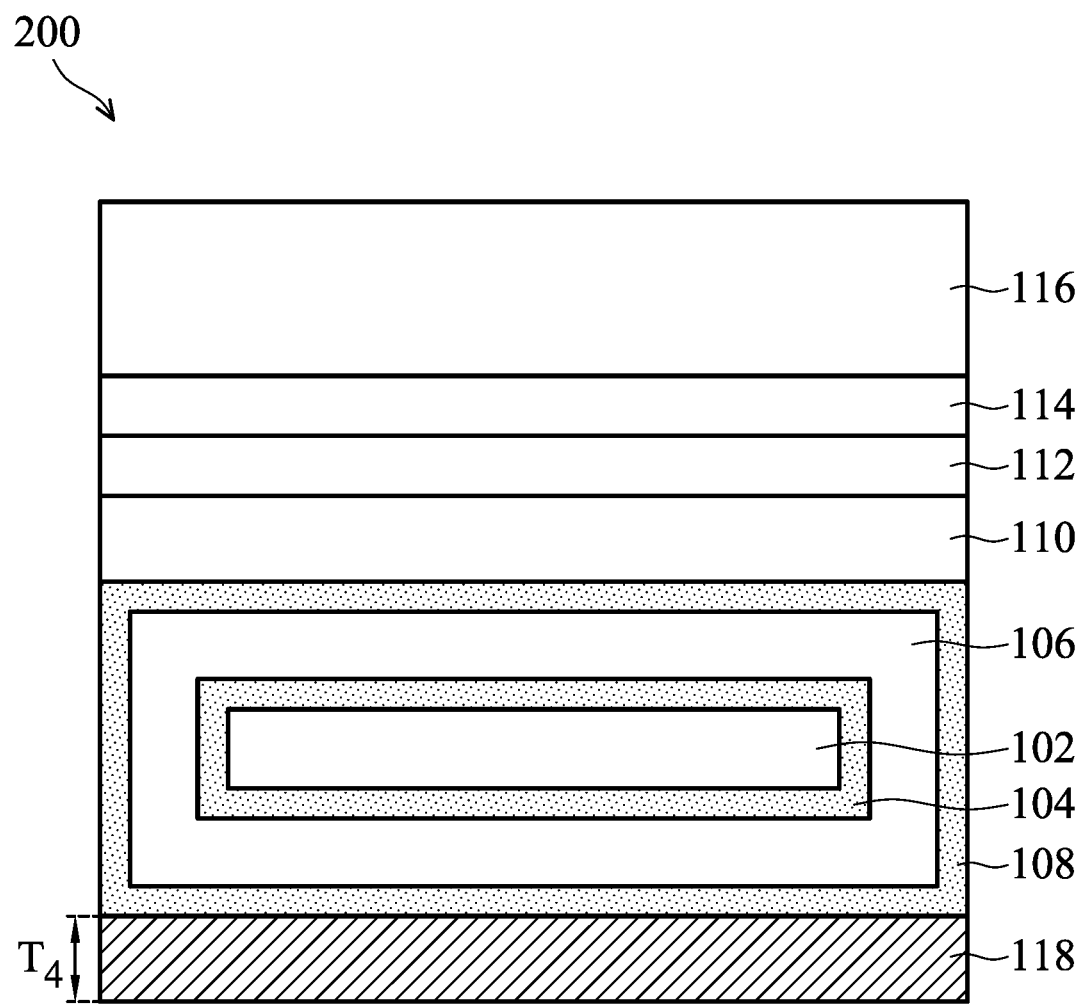
FIG. 2 is a cross-sectional view illustrating a substrate in accordance with another embodiment of the present disclosure.

FIG. 2 is a cross-sectional view illustrating a substrate 200 in accordance with another embodiment of the present disclosure. For simplicity, the same elements will be described by the same symbols, and the formation and materials of these elements are described above, and therefore will not be described again. In comparison with the embodiment of FIGS. 1A-1B, the following embodiment provides a conductive layer 118 on the second adhesion layer 108, so that the substrate 200 can be applied to semiconductor processing tools which use electrostatic adsorption, such as an electric static chuck (ESC).

In some embodiments, as illustrated in FIG. 2, the epitaxial layer 116 is disposed on a first side of the second adhesion layer 108, and the conductive layer 118 is formed on a second side of the second adhesion layer 108, the second side is opposite the first side. The conductive layer 118 may be formed by a deposition process, such as a CVD process, a physical vapor deposition (PVD) process, an atomic layer deposition (ALD) process, the like, or a combination thereof. In some embodiments, the conductive layer 118 has a thickness T4 ranging from about 1000 Å to about 10000 Å, such as from about 3000 Å to about 6000 Å.

In some embodiments, the conductive layer 118 may include a material having a high melting point to applicable to subsequent process. For example, in embodiments where the epitaxial layer 116 includes gallium nitride, which is typically growth at 1100° C., the conductive layer 118 may be selected from materials having a melting point above about 1400° C. In some embodiments, the conductive layer 118 may include Ti, TiN, Co, Ni, Pt, Ta, TaN, SiCr, the like, or a combination thereof.

As illustrated in FIG. 2, the second adhesion layer 108 includes a third side between the first side and the second side, and a sidewall of the conductive layer 118 is coplanar with a sidewall of the third side of the second adhesion layer 108. In accordance with some embodiments, the sidewall of the conductive layer 118 does not extend beyond the sidewall of the third side of the second adhesion layer 108 to avoid the extended portion forming a leakage path.

In the above embodiment, the present disclosure provides the conductive layer 118 on the substrate 200 to make the substrate 200 applicable to semiconductor processing tools which use electrostatic adsorption. Moreover, conductive layer 118 includes a material having a high melting point to applicable to subsequent process in accordance with some embodiments. Additionally, the present disclosure adjusts the sidewall of the conductive layer 118 to avoid forming undesirable leakage paths.

In summary, the present disclosure adjusts the flow rate ratio of the oxygen source to the nitrogen source during a deposition process, wherein a higher oxygen flow rate is used to form an adhesive layer, and a higher nitrogen flow rate is used to form a barrier layer, thus the adhesive layer and the barrier layer including silicon oxynitride having different atomic number ratios of nitrogen to oxygen can be formed. In comparison with the substrate including an adhesive layer and a barrier layer having different materials, the substrate and the method for forming the same provided by the present disclosure can simplify the process and reduce the production cost. The simplification of the process can avoid forming undesirable defects on the substrate, thereby improving yield and reliability of the substrate.

In some embodiments, a conductive layer is disposed on the substrate to make the substrate applicable to semiconductor processing tools which use electrostatic adsorption. In some embodiments, the conductive layer includes a material having a high melting point to applicable to subsequent process. In some embodiments, a sidewall of the conductive layer is adjusted such that the sidewall of the conductive layer do not extend beyond the sidewall of the adhesive layer to avoiding the extended portion forming a leakage path.

While the present disclosure has been described above by various embodiments, these embodiments are not intended to limit the disclosure. Those skilled in the art should appreciate that they may make various changes, substitutions and alterations based on the embodiments of the present disclosure to realize the same purposes and/or advantages as the various embodiments described herein. Those skilled in the art should also appreciate that such design or modification practiced does not depart from the spirit and scope of the disclosure. Therefore, the scope of protection of the present disclosure is defined as the subject matter set forth in the appended claims.

What is claimed is:

1. A substrate, comprising:
    a ceramic core;
    a first adhesion layer encapsulating the ceramic core and comprising silicon oxynitride, wherein an atomic number ratio of oxygen to nitrogen in silicon oxynitride of the first adhesion layer has a first ratio;
    a barrier layer encapsulating the first adhesion layer and comprising silicon oxynitride, wherein an atomic number ratio of oxygen to nitrogen in silicon oxynitride of the barrier layer has a second ratio that is different from the first ratio; and
    a second adhesion layer encapsulating the barrier layer and comprising silicon oxynitride, wherein an atomic number ratio of oxygen to nitrogen in silicon oxynitride of the second adhesion layer has a third ratio that is different from the second ratio.

2. The substrate as claimed in claim 1, wherein the first ratio and the third ratio are each independently in a range from 6:4 to 9:1.

3. The substrate as claimed in claim 1, wherein the second ratio is in a range from 1:9 to 4:6.

4. The substrate as claimed in claim 1, wherein a ratio of a thickness of the barrier layer to a thickness of the first adhesion layer or a thickness of the second adhesion layer is in a range from 3 to 6.

5. The substrate as claimed in claim 1, wherein the ceramic core comprises aluminum nitride, gallium nitride, aluminum gallium nitride, silicon carbide, zinc oxide, gallium oxide, or a combination thereof.

6. The substrate as claimed in claim 1, further comprising:
    an epitaxial layer disposed on a first side of the second adhesion layer and comprising a III-V semiconductor material; and
    a bonding layer disposed between the epitaxial layer and the second adhesion layer.

7. The substrate as claimed in claim 6, further comprising a filling layer disposed between the bonding layer and the second adhesion layer.

8. The substrate as claimed in claim 6, further comprising a conductive layer disposed on a second side of the second adhesion layer, wherein the second side is opposite the first side.

9. The substrate as claimed in claim 8, wherein a sidewall of the conductive layer is coplanar with a sidewall of a third side of the second adhesion layer, and the third side is between the first side and the second side.

10. The substrate as claimed in claim 8, wherein the conductive layer includes Ti, TiN, Co, Ni, Pt, Ta, TaN, SiCr, or a combination thereof.

11. The substrate as claimed in claim 8, wherein a thickness of the conductive layer is in a range from 1000 Å to 10000 Å.

12. A method for forming substrates, comprising:
    providing a ceramic core; and
    providing a silicon source, an oxygen source, and a nitrogen source during a deposition process to sequentially form a first adhesion layer encapsulating the ceramic core, a barrier layer encapsulating the first adhesion layer, and a second adhesion layer encapsulating the barrier layer,
    wherein an atomic number ratio of oxygen to nitrogen of the first adhesion layer, an atomic number ratio of oxygen to nitrogen of the barrier layer, and an atomic number ratio of oxygen to nitrogen of the second adhesion layer have a first ratio, a second ratio, and a third ratio, respectively, and wherein the second ratio is different from the first ratio, and the third ratio is different from the second ratio.

13. The method as claimed in claim 12, wherein the first ratio and the third ratio are each independently in a range from 6:4 to 9:1.

14. The method as claimed in claim 12, wherein the second ratio is in a range from 1:9 to 4:6.

15. The method as claimed in claim 12, wherein the oxygen source comprises water vapor, oxygen, ozone, or a combination thereof, the nitrogen source comprises ammonia, nitrogen, or a combination thereof, and the deposition process comprises adjusting a flow rate ratio of oxygen to nitrogen from 8:2 to 2:8 and then to 8:2.

16. The method as claimed in claim 12, wherein the deposition process comprises a chemical vapor deposition process.

17. The method as claimed in claim 12, further comprising:
   forming a bonding layer on a first side of the second adhesion layer;
   forming an epitaxial layer on the bonding layer; and
   forming a conductive layer on a second side of the second adhesion layer, wherein the second side is opposite the first side.

18. The method as claimed in claim 17, wherein a sidewall of the conductive layer is coplanar with a sidewall of a third side of the second adhesion layer, and the third side is between the first side and the second side.

19. The method as claimed in claim 17, wherein the conductive layer comprises Ti, TiN, Co, Ni, Pt, Ta, TaN, SiCr, or a combination thereof.

20. The method as claimed in claim 17, further comprising forming a filling layer prior to forming the bonding layer, wherein the filling layer comprises a multilayer structure.

\* \* \* \* \*